Oct. 17, 1961 JACQUES I. PANTCHECHNIKOFF NOW BY CHANGE OF NAME JACQUES I. PANKOVE 3,005,132

TRANSISTORS

Filed June 13, 1952

INVENTOR
JACQUES I. PANTCHECHNIKOFF
NOW BY CHANGE OF NAME TO
JACQUES I. PANKOVE

BY H. W. Newton
ATTORNEY

United States Patent Office 3,005,132

Patented Oct. 17, 1961

3,005,132

TRANSISTORS

Jacques I. Pantchechnikoff, now by change of name Jacques I. Pankove, Princeton, N.J., assignor to Radio Corporation of America, a corporation of Delaware Filed June 13, 1952, Ser. No. 293,330
1 Claim. (Cl. 317—235)

This invention relates generally to semi-conductor devices or transistors, and more particularly to the electrode configuration for semi-conductor devices having a plurality of zones of different conductivity types within the body of semi-conducting material.

Such semi-conductor devices suitable for use in signal translating systems such, for example, as amplifier, oscillator or modulator circuits are well known. Such devices may include a semi-conducting body and an emitter electrode, a collector electrode and a base electrode in contact with the body.

As presently known and understood transistors may generally be divided into two classes. One class of transistors includes the point-contact transistor wherein the semi-conducting body may be of the N-type germanium crystal, that is, a crystal having an excess of electrons due to the presence of a donor impurity therein; or the body may comprise a P-type germanium crystal, that is, a crystal having a deficiency of electrons due to the presence of an acceptor impurity therein. The base electrode of the transistor is in low-resistance contact with the body and the other two electrodes consist of probes in rectifying contact with the body.

The other class of transistors includes the junction transistor wherein the semi-conducting body has electrical rectifying boundary or junction areas existing between P-type and N-type conductivity zones. In the latter class of transistors each of the electrodes may be in low-resistance contact with a particular one of the P-type or N-type zones. Each of the electrodes, upon being biased in the forward or easy flow direction with respect to the base electrode injects minority charge carriers into that conduction zone to which the base electrode is connected. Thus holes are injected into a zone of N-type conductivity and electrons are injected into a zone of P-type conductivity.

A junction transistor may be made by diffusing certain metal such, for example, as aluminum, boron, gallium or indium into opposite facets or sides of a thin N-type germanium body to form a PNP type junction transistor. Boron, aluminum, gallium and indium are known as P-type or acceptor impurities because they convert that portion of an N-type germanium body into which they are diffused into a P-type region. This results from the fact that atoms of these metals "accept" electrons from the surrounding germanium lattice and thereby provide a deficiency of electrons or an excess of holes in that region of the body into which they diffuse.

Similarly an NPN type junction transistor may be made by converting portions of a P-type germanium body into N-type portions. This may be accomplished by diffusing N-type or donor impurities into opposite sides of the P-type body. Typical donor impurities are phosphorus, arsenic, antimony, and bismuth. These impurities convert P-type germanium to N-type germanium by "donating" electrons to the germanium structure and thereby providing an excess of electrons in that portion of the body into which they diffuse.

In a paper entitled "Properties and Applications of N-P-N Transistors" by R. L. Wallace, Jr. and W. J. Pietenpol, which appears in Proceedings of the IRE, volume 39, No. 7, page 753, July 1951, there is discussed in part the desirability of making the current gain of a junction transistor as nearly equal to unity as possible.

The current gain of a transistor is conventionally denoted by the Greek letter $\alpha$. $\alpha$ is defined as the change in collector current per unit change in emitter current for a constant collector bias voltage.

It is known that $\alpha$ is important in determing some of the circuit properties of the transistor and that many of the circuit properties become more desirable as $\alpha$ approaches unity in a junction transistor.

The charge carriers injected into the crystal by the emitter electrode flow from the emitter to the collector electrode and thereby determine the collector current. A change of emitter current results in a corresponding change in collector current. If all the charge carriers which are injected into the crystal reach the collector electrode, the crystal will have a current gain equal to unity.

The charge carriers injected into the crystal by the emitter junction pass through the base region of the transistor to the collector principally by diffusion. By providing a collector electrode of suitable configuration and of a size that is relatively large as compared to the size of the emitter electrode almost all of the charge carriers injected by the emitter can be collected at the collector and the semi-conductor device will have a current gain, or $\alpha$, very nearly equal to unity. The transfer characteristics of the semi-conductor device of the presnt invention are, therefore, non-symmetrical. That is, if the smaller electrode were connected as a collector, and the larger electrode as an emitter the current gain, $\alpha$, would be substantially less than unity.

It is therefore, an object of the present invention to provide an improved transistor or semi-conductor device having a current gain, $\alpha$, which very nearly approaches unity.

A further object of the invention is to provide a transistor having an improved electrode configuration whereby charge carriers injected by an emitter electrode are substantially all collected by a collector electrode.

Another object of the invention is to provide an improved transistor device suitable for use in signal translating systems wherein the configuration and relative size of the electrodes provide an improved frequency response.

In accordance with the present invention a semi-conductor device is provided with a semi-conducting body having two concentrically aligned zones or regions of a particular conductivity type separated by a zone or region of opposite conductivity type. The junctions between each two zones constitute electrical or rectifying barriers. The zones of like conductivity are provided in the body by diffusing an acceptor or a donor impurity into the body. The junctions thus formed provide the emitter and the collector junctions for the semi-conductor devices. The collector junction is made to have a size which is relatively larger than the size of the emitter junction. There is further provided a base electrode in low resistance contact with the intermediate zone of the body.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
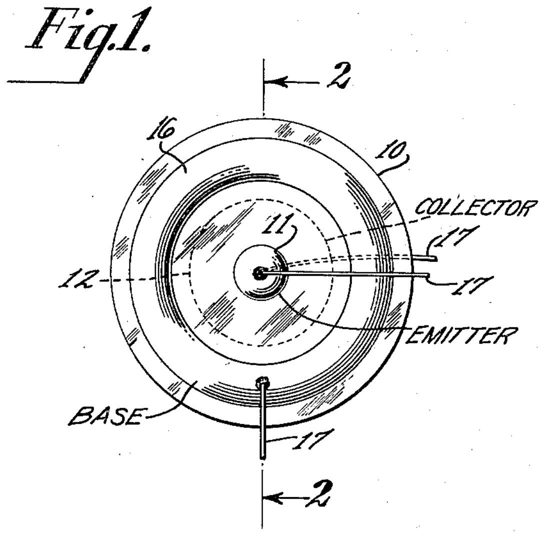
FIGURE 1 is a plan view of a semi-conductor device in accordance with the present invention.
Figure 2:
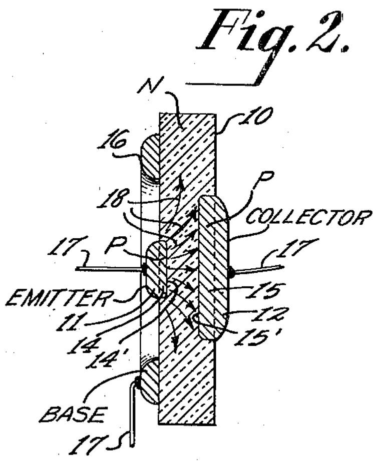
FIGURE 2 is a sectional view of the semi-conductor device of FIGURE 1 taken on line 2—2 of FIGURE 1.

Referring now to the drawing, in which like components have been designated by the same reference numerals throughout the figures, there is illustrated in FIGURES 1 and 2 a semi-conducting body 10 which may consist of a crystal of silicon or germanium. The crystal may be of the P-type or of the N-type, but for the following discussion it will be assumed that it is of the N-type.

An emitter electrode 11 and a collector electrode 12 are alloyed in concentric alignment as shown in the figures on opposite sides of the body 10. The emitter and collector electrodes consist of an acceptor metal such for example as aluminum, boron or preferably indium. By heat treating the electrodes 11 and 12 in contact with the crystal body 10 the acceptor metal diffuses into the N-type crystal body 10 changing it to provide P-type zones 14 and 15. Zones 14 and 15 are separated from the remaining N-type portion by the electrical rectifying barriers or junctions 14' and 15'. There is thus provided a semi-conductor device having two zones of P-type conductivity separated by a zone of N-type conductivity.

Although body 10 may be chosen of any thickness, satisfactory results have been obtained with a thickness approximately equal to 0.003–0.006 inch. By way of example, the electrode 11 may have a thickness of approximately 0.010 inch, and a diameter of 0.015 inch, and electrode 12 may have a thickness of approximately 0.010 inch and a diameter of approximately 0.080 inch.

A base electrode 16 may be attached to the body 10 by soldering a suitable metal to the body. The electrode 16 is in low resistance contact with the body, and instead of being soldered thereon it may be sprayed, painted or otherwise coated thereon. The base electrode may surround the emitter, or the collector or both electrodes and encloses a substantial area of the body 10. This provides a more uniform diffusion of the minority carriers injected into the body 10 by the emitter electrode. However, the base electrode 16 may consist of any low resistance connection to body 10. Suitable conductors 17 are soldered to each of the electrodes.

In accordance with the present invention, the collector electrode 12 has a size which is relatively larger than the size of the emitter electrode 11. Consequently, the P-type zone 15 and barrier 15' are relatively larger than the P-type zone 14 and barrier 14'. The emitter electrode, upon being properly biased with respect to the base electrode, injects minority carriers or holes into the body 10. Most of the applied bias voltages appear as potential drops at the barriers 14' and 15', and the electric field in the body 10 is negligible. As a result the electric field between the base electrode and the barrier 14' has little effect upon the movement of the minority carriers and upon passing the barrier 14' the carriers diffuse as indicated by the arrows 18. The carriers are intercepted by the large area barrier 15' and pass into the P-type zone 15. The collector junction 15' covering a relatively large portion of the body 10 is able to collect nearly all of the injected holes.

In the manufacture of PNP type junction transistors the following method has been employed with considerable success. The method generally comprises three steps which include the preparation of the N-type germanium body, the preparation of the acceptor impurity, indium; and the firing or diffusing of the indium into the germanium body.

The germanium body is obtained from a single-crystal of germanium which may have any resistivity although satisfactory results have been obtained with a resistivity of from 2–5 ohm-centimeters. The resistivity of the germanium is usually an important factor in transistor operation, and its control is highly critical. The resistivity is dependent upon the presence in the germanium of minute quantities of donor or acceptor impurities. The resistivity of pure germanium is approximately 60 ohm-centimeters. If too many impurity atoms are present the germanium becomes too conductive and transistor action is adversely affected. It is desirable, therefore, to remove as many impurities as possible by purification techniques so that controlled amounts of them may be added to obtain the desired values of resistivity. On the other hand, however, the resistivity of the region between the junctions can be controlled by the amount of impurities diffused into said region. The conductivity type of these impurities is opposite that of said region but their concentration is very small. The effect of these impurities is to increase the resistivity of the region between the junctions. In view of this possibility of controlling the resistivity in the region between the two junctions the choice of the initial resistivity of body 10 is not critical. By way of example, having obtained a single-crystal of germanium the crystal is sliced into thin sections or wafers 0.020 inch in thickness. The wafers are then diced into thin bodies approximately 0.060 square inch.

For satisfactory transistor operation the surface of the crystal bodies should be absolutely clean and the crystalline structure at the surface should be undisturbed. The thickness of the disordered crystalline layer at the surface of the bodies produced by slicing and dicing the crystal into thin bodies is believed to be several mils in thickness. Accordingly, the bodies are etched in a suitable etching solution until the bodies are approximately 0.003–0.006 inch thick. The etching solution may, for example, include nitric acid and hydrofluoric acid. The volume of the etching solution should be large enough to prevent rapid evolution of gases. The bodies having been etched to the desired thickness, are washed in hot running water having a temperature of about 50° centigrade, rinsed in distilled water, and dried by being placed in a screen basket which is suspended in a warm air stream. The crystal bodies are now ready to receive the acceptor impurity, indium.

Relatively pure indium is diffused into a crystal body. The indium is punched into round disks of two sizes, each having a thickness of 0.010 inch. The diameter of the smaller disk is approximately 0.015 inch, and the diameter of the larger disk is approximately 0.080. The disks are cleaned by degreasing them in ether, washing them in water, and drying them.

The indium disks undergo the process of diffusion into the crystal bodies in an atmosphere of hydrogen which has first been de-oxidized and dried in a liquid air trap. The larger of the two indium disks is placed approximately in the center of the body and fired at a temperature of 250° C. for about one minute. This initial firing is for the purpose of attaching the larger disk to the body to facilitate handling. A small indium disk is then placed on the other side of the body in concentric alignment with the larger indium disk as shown in the figures. The body carrying the two indium disks is then fired at a temperature of from 400° C. to 500° C. for 10 to 20 minutes, during which time indium melts and alloys with, then further diffuses into the crystal body.

The smaller electrode thus formed comprises the emitter electrode, and the larger electrode thus formed comprises the collector electrode of the completed semi-conductor device. A lead or conductor 17 is connected in low-resistance contact to each of the electrodes by soldering or other suitable means. A base electrode may be provided by soldering a nickel strip to the germanium body.

Figure 3:
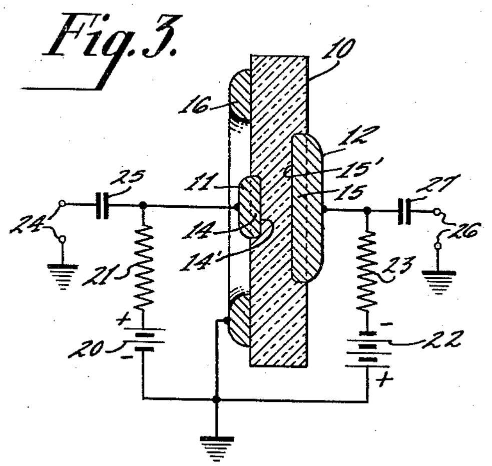
FIGURE 3 is a schematic sectional view and circuit diagram of a semi-conductor device embodying the present invention and connected in an amplifier circuit.

In FIGURE 3 there is illustrated by way of example an amplifier circuit embodying a semi-conductor device in accordance with the present invention. A comparatively small bias voltage in the forward direction is impressed between emitter 11 and base 16. A bias voltage in the forward direction may be defined as the polarity for which anomalous carriers are introduced, into the body 10, that is, which introduces holes into an N-type crystal or electrons into a P-type crystal. Generally, when the emitter is biased in the forward direction it should be positive with respect to an N-type crystal and negative with respect to a P-type crystal. To this end there may be provided a suitable voltage source such as battery 20, having its negative terminal connected to base 16, while its positive terminal is connected to emitter 11 through an impedance element such as resistor 21. Base 16 may be grounded as shown. Furthermore, a comparatively large bias voltage in the reverse direction is impressed between the collector 12 and base 16.

A bias voltage in the reverse direction is applied between collector 12 and base 16 and may be defined as a potential which opposes the introduction of holes into an N-type crystal or electrons into a P-type crystal. The collector 12 should be negative with respect to the base 16 if the base is an N-type crystal and should be positive with respect to the base 16 if the base is a P-type crystal. To this end there is provided a suitable source of voltage such as battery 22 having its positive terminal grounded, that is, connected to the base 16, while its negative terminal is connected by a lead through an impedance element such as resistor 23 to collector 12. An input signal may be impressed on input terminals 24, one of which is grounded while the other one is coupled through coupling capacitor 25 to the emitter 11. An amplified output signal may be developed across load resistor 23 and may be obtained from output terminals 26, one of which is grounded while the other one is coupled through coupling capacitor 27 to the collector 12.

Figure 4:
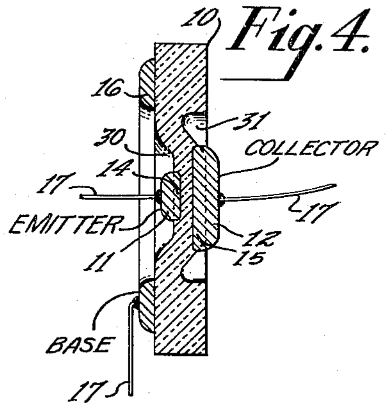
FIGURE 4 is a sectional view of a further embodiment of a semi-conductor device in accordance with the present invention.

In FIGURE 4 there is shown a further embodiment of a semi-conductor device in accordance with the present invention. In this embodiment, the body 10 has selected portions etched away to provide indentations or cavities 30 and 31 on either side of the body. The thickness of the body between the junctions is thereby decreased and the frequency response of the device is increased. The emitter electrode 11 is positioned within the cavity 30. The cavity 31 is of an annular, or ring configuration. As shown in FIGURE 4, the annular cavity 31 is co-axial with respect to the indentation 30. The collector electrode 12 is positioned symmetrically with respect to cavity 31 and covers a portion of the edge or side of cavity 31. The base electrode 16 surrounds the emitter electrode 14 and includes a substantial portion of the body 10.

A number of units made in accordance with the present invention were tested, and the measurement of the current gain, $\alpha$, as a function of the collector diameter and emitter diameter was obtained. The results are shown in the following table:

| Transistor Designation | Collector Diameter In Inches | Emitter Diameter In Inches | Current Gain |
|---|---|---|---|
| 1 | 0.025 | 0.025 | .85 |
| 2 | 0.025 | 0.025 | .70 |
| 3 | 0.025 | 0.025 | .75 |
| 4 | 0.025 | 0.025 | .75 |
| 5 | 0.025 | 0.025 | .79 |
| 6 | 0.025 | 0.025 | .75 |
| 7 | 0.045 | 0.015 | .87 |
| 8 | 0.045 | 0.015 | .75 |
| 9 | 0.045 | 0.015 | .85 |
| 10 | 0.045 | 0.015 | .50 |
| 11 | 0.085 | 0.015 | .97 |
| 12 | 0.125 | 0.015 | .98 |
| 13 | 0.125 | 0.015 | .97 |
| 14 | 0.125 | 0.015 | .98 |
| 15 | 0.125 | 0.015 | .91 |
| 16 | 0.015 | 0.045 | .33 |
| 17 | 0.015 | 0.045 | .18 |
| 18 | 0.015 | 0.045 | .44 |
| 19 | 0.015 | 0.045 | .17 |

The above data were obtained for units having a crystal body of germanium approximately 0.006 inch in thickness, and having a resistivity of 3 ohm-centimeters. It is apparent from the above data that as the collector area is increased, the current gain, $\alpha$, of the device more nearly approaches unity.

There has thus been disclosed an improved semi-conductor device suitable for signal translating systems. The device includes a body of semi-conducting material having two zones of the same conductivity type and a further zone of opposite conductivity type separating the first two zones. The junction areas separating the zones are of unequal sizes. A collector electrode is provided for the device and has a size which is substantially larger than the size of the emitter electrode. The device has a current gain which approaches unity and a comparatively high power gain.

What is claimed is:

A semi-conductor device comprising a body of semiconducting material of N-type conductivity, having two sides both sides of said body having indentations therein, at least one of said indentations having substantially an annular configuration co-axial with the other one of the said two indentations, an emitter junction of a predetermined area positioned within one of said indentations, a first region of P-type conductivity enclosed by said emitter junction, a collector junction having an area larger than that of said emitter junction symmetrically positioned with respect to said indentation of annular configuration, a second region of P-type conductivity enclosed by said collector junction, an emitter electrode connected to said first region of P-type conductivity, a collector electrode connected to said second region of P-type conductivity, and a base electrode symmetrically positioned with respect to said emitter electrode and in low resistance contact with a substantial portion of said body.

References Cited in the file of this patent

UNITED STATES PATENTS

| | | |
|---|---|---|
| 2,524,035 | Bardeen et al. | Oct. 3, 1950 |
| 2,561,411 | Pfann | July 24, 1951 |
| 2,563,503 | Wallace | Aug. 7, 1951 |
| 2,569,347 | Shockley | Sept. 25, 1951 |
| 2,570,978 | Pfann | Oct. 9, 1951 |
| 2,623,102 | Shockley | Dec. 23, 1952 |
| 2,631,356 | Sparks et al. | Mar. 17, 1953 |
| 2,644,852 | Dunlap | July 7, 1953 |
| 2,666,814 | Shockley | Jan. 19, 1954 |
| 2,672,528 | Shockley | Mar. 16, 1954 |
| 2,691,750 | Shive | Oct. 12, 1954 |
| 2,817,798 | Jenny | Dec. 24, 1957 |
| 2,845,374 | Jones | July 29, 1958 |